United States Patent
Di Giandomenico et al.

(10) Patent No.: US 7,796,072 B2
(45) Date of Patent: *Sep. 14, 2010

(54) MULTIPLE MODE SIGMA-DELTA MODULATOR

(75) Inventors: Antonio Di Giandomenico, Velden am Worthersee (AT); David San Segundo Bello, Villach (AT); Andreas Wiesbauer, Portschach (AT); Fabio Ballarin, Villach (AT); Martin Clara, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 12/255,038

(22) Filed: Oct. 21, 2008

(65) Prior Publication Data

US 2009/0102689 A1    Apr. 23, 2009

Related U.S. Application Data

(63) Continuation of application No. 11/850,000, filed on Sep. 4, 2007, now Pat. No. 7,486,214.

(51) Int. Cl.
*H03M 3/00* (2006.01)

(52) U.S. Cl. .................. 341/143; 341/120; 341/155; 327/552; 327/553

(58) Field of Classification Search ............. 341/120, 341/143; 327/552, 553
See application file for complete search history.

(56) References Cited

U.S. PATENT DOCUMENTS

| | | | |
|---|---|---|---|
| 5,248,970 | A | 9/1993 | Sooch et al. |
| 5,729,230 | A | 3/1998 | Jensen et al. |
| 6,693,572 | B1 | 2/2004 | Oliaei et al. |
| 6,967,606 | B2 | 11/2005 | Wiesbauer et al. |
| 6,989,778 | B2 | 1/2006 | Clara et al. |
| 7,042,375 | B1 | 5/2006 | van Engelen |
| 7,095,345 | B2 | 8/2006 | Nguyen et al. |
| 7,098,730 | B1 | 8/2006 | Shui |
| 7,151,474 | B2 | 12/2006 | Ortmanns et al. |
| 7,242,336 | B1 * | 7/2007 | Jensen ................. 341/143 |
| 7,551,109 | B1 * | 6/2009 | Ashmore, Jr. .......... 341/120 |
| 2006/0012499 | A1 | 1/2006 | Ihs et al. |
| 2007/0069931 | A1 | 3/2007 | Hsieh et al. |

OTHER PUBLICATIONS

Corsi et al., "Pseudo-Random Sequence Based Tuning System for Continuous-Time Filters," Automation and Test in Europe Conference and Exhibition, 2004, Proceedings, Feb. 16-20, 2004, pp. 94-99.
Ortmanns et at., "Influence of Finite Integrator Gain Bandwidth on Continuous-Time Sigma Delta Modulators," Proc. of ISCAS2003, May 2003, vol. 1, pp. I-925-I-928.
Redman-White et al., "Integrated fourth-order sigma-delta converter with stable self-tuning continuous-time noise shaper," IEEE Proc. Circuits Devices Syst., vol. 141, No. 3, Jun. 1994, pp. 145-150.

* cited by examiner

*Primary Examiner*—Khai M Nguyen
(74) *Attorney, Agent, or Firm*—Lee & Hayes, PLLC

(57) ABSTRACT

Modulation circuits for operating in at least a first and second mode are described herein.

19 Claims, 4 Drawing Sheets

MULTIPLE MODE SIGMA-DELTA MODULATOR

RELATED PATENT APPLICATIONS

This U.S. patent application is a continuation of, claims the benefit of priority from, and hereby incorporates by reference the entire disclosure of, co-pending U.S. application for Letters patent Ser. No. 11/850,000 filed Sep. 4, 2007, and titled "Tuning Methods for Loop-Filters of Continuous-Time Sigma-Delta Modulators."

BACKGROUND

There are many types of electrical circuits that employ modulators. Communications circuits for transmitting and receiving communication signals, for example, typically include receiver or transceiver circuits having modulators. Such communication circuits may be used in a wide variety of devices and applications, including telephones, televisions, wireless computing devices, audio devices, personal data assistants (PDAs), and any other suitable systems that communicate signals. Of course, in addition to communications circuits, many other types of electrical circuits may include modulators.

Sigma delta modulators operating as continuous-time modulators, so-called continuous-time sigma-delta modulators, have the advantage of lower power consumption than sigma-delta modulators operating as discrete-time modulators. Alternately, a higher signal bandwidth may be achieved for the signal processing with the same power consumption, therefore making them attractive for all x-DSL Analog-Front-End transceivers. Continuous-time sigma-delta modulators are particularly suitable for wireless signal transmission devices over their discreet-time (DT) equivalents.

A block diagram of a continuous-time sigma-delta (CTSD) modulator 50 is shown in FIG. 1. The CTSD modulator 50 includes a continuous-time loop-filter 52 which represents the core of the modulator 50. An analog input 60 is applied to the continuous-time loop-filter 52, and a filtered analog output 62 is passed from the continuous-time loop-filter 52 to an analog-to-digital converter (ADC) 64. A filtered digital output 66 is transmitted from the ADC 64 of the CTSD modulator 50 to other components of the circuit or device. The filtered digital output 66 is also fed back to a digital-to-analog converter (DAC) 68, and is returned to the continuous-time loop-filter 52. In brief, the CTSD modulator 50 receives the analog input 60 and, using the continuous-time loop-filter 52, encodes the analog input 60 at clock intervals to provide the filtered digital output 66. The feedback of the filtered digital output 66 (provided to the DAC 68) is received as an analog signal back into the continuous-time loop-filter 52 where it may be used during the encoding. The structural and operational aspects of continuous-time loop-filters are described more fully, for example, in U.S. Pat. Nos. 7,151,474 issued to Ortmanns et al., 7,042,377 issued to Oliaei, 6,989,772 issued to Clara et al., and 6,396,428 issued to Cheng.

As depicted in FIG. 1, the continuous-time loop filter 52 can be implemented in several ways, such as by using resistor-capacitors 54, transconductor-capacitors 56, MOSFET-capacitors 58, or any other suitable components. In each of these different kinds of implementations, however, certain time constraints of the continuous-time loop filter 52 are typically defined by uncorrelated components.

A general drawback with the CTSD modulator 50 is that filtering coefficients used within the continuous-time loop-filter 52 vary during performance of the CTSD modulator 50. In some cases, a wide range of process spread can cause the coefficients to vary by up to +/−40%. Such variations typically cause a performance loss by the CTSD modulator 50 and, when the filter design is very aggressive (i.e. in high order systems with low over-sampling ratio), may also cause unstable performance.

When the CTSD modulator 50 is embedded in a more complex system, such as a communication circuit of a communication device, it may be desirable to provide an automatic tuning technique that sets the coefficients to desired or optimal values either once at the beginning during the start-up phase, or adaptively in a continuous background process. Such tuning techniques have conventionally required considerable additional circuitry overhead, and may also require a replica of the overall complex system with which to conduct trial-and-error evaluations to empirically determine the desired coefficient values. Novel tuning techniques that mitigate these undesirable aspects of the prior art would have considerable utility.

BRIEF DESCRIPTION OF THE DRAWINGS

The detailed description is described with reference to the accompanying figures. The use of the same reference numbers in different instances in the description and the figures may indicate similar or identical items.

DETAILED DESCRIPTION

Disclosed herein are improved tuning techniques for loop-filters of continuous-time sigma-delta (CTSD) modulators. In general, techniques in accordance with the present disclosure may advantageously eliminate the need for replica circuits, properly take into account non-idealities of the loop-filter being tuned, reduce power consumption and improve tuning speed in comparison with known tuning techniques.

In general, implementations in accordance with the present disclosure perform tuning of the loop-filter using the actual components of the CTSD modulator. A stimulus signal is provided to an existing digital-to-analog (D/A) converter of the CTSD modulator, and the stimulus signal is fed into the loop-filter of the CTSD modulator. A response of the loop-filter is received and analyzed by an existing analog-to-digital (A/D) converter of the CTSD modulator, and is analyzed to determine whether adjustments to the loop-filter are needed. In this way, the tuning of the loop-filter becomes purely digital, as stimulus and response are both digital. As described more fully below, since the novel tuning techniques use the loop-filter itself, considerable advantages in tuning accuracy and economy may be realized.

Techniques for tuning loop-filters of CTSD modulators in accordance with the present disclosure may be implemented in a number of ways. One example environment and context is provided below with reference to the included figures and the on going discussion.

Exemplary Systems

Figure 2:
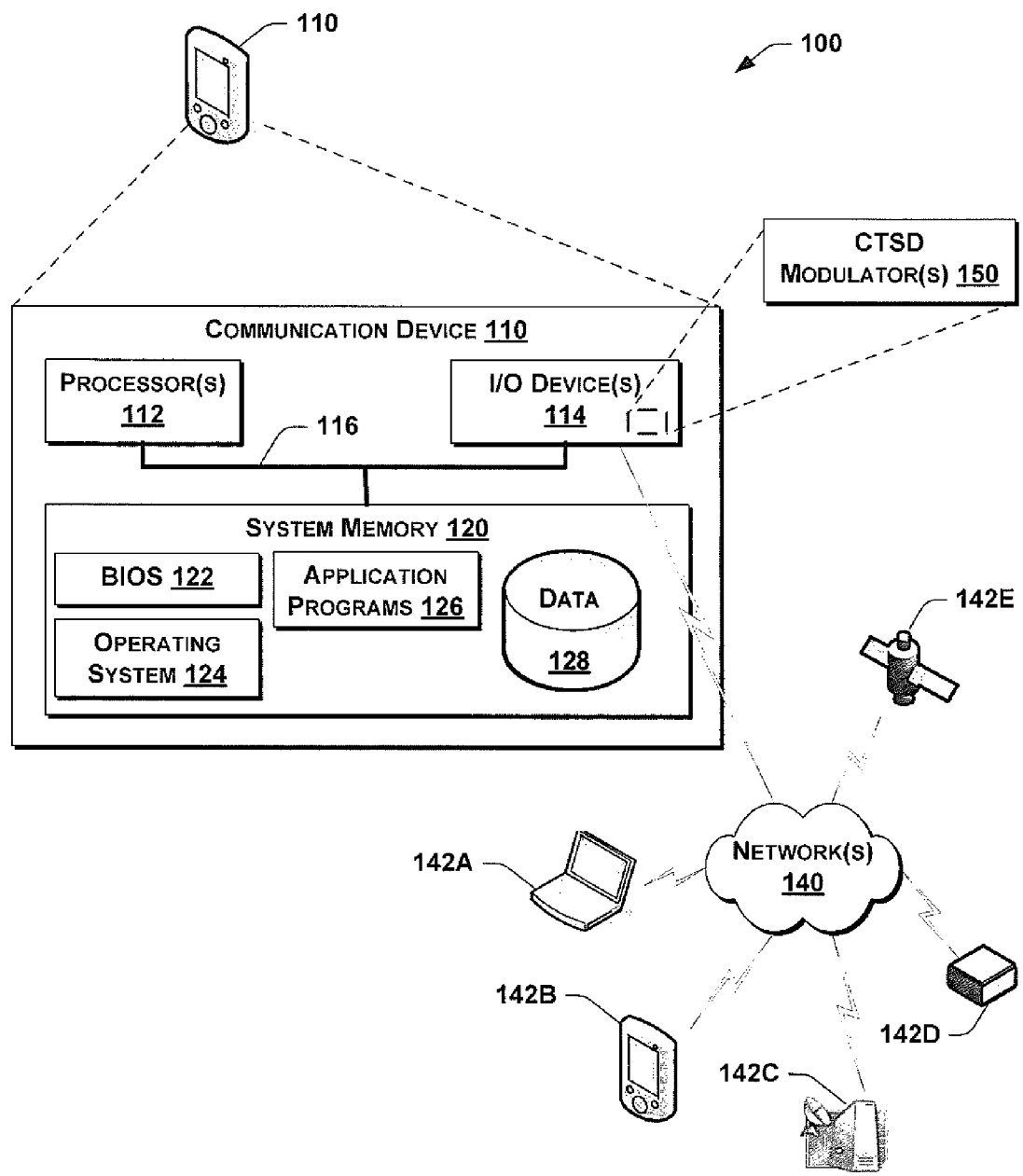
FIG. 2 is an exemplary environment in which techniques in accordance with the present disclosure may be implemented.

FIG. 2 illustrates an exemplary environment 100 in which techniques in accordance with the present disclosure may be implemented. In this implementation, the environment 100 includes a communication device 110 having one or more continuous-time sigma-delta (CTSD) modulators 150 configured in accordance with the teachings of the present disclosure. The communication device 110 operatively communicates via one or more networks 140 with a plurality of other communication devices 142. Alternately, the communication device 110 may bypass the networks 140 and communicate directly with one or more of the other communication devices 142.

In the representative environment 100, the communication device 110 is a hand-held device, such as a cell phone, a personal data assistant (PDA), a global positioning system (GPS) unit, or other similar hand-held device, and the other communication devices 142 may include, for example, a computer 142A, another hand-held device 142B, a ground-based communication station 142C, a vehicle-mounted communication device 142D (e.g. radio, navigational unit, television, etc.), and a satellite 142E. In alternate implementations, of course, the communication devices 110, 142 may include any other suitable devices, and it is understood that any of the plurality of communication devices 142 may be equipped with CTSD modulators 150 that operate in accordance with the teachings of the present disclosure.

As further shown in FIG. 2, the communication device 110 includes one or more processors 112 and one or more input/output (I/O) devices 114 (e.g., transceivers, transmitters, receivers, etc.) coupled to a system memory 120 by a bus 116. In the implementation shown in FIG. 2, the CTSD modulator 150 is included within the I/O component 114 of the communication device 110. In alternate implementations, however, the CTSD modulator 150 may be integrated with any other suitable portion of the device 110, or may be a separate, individual component of the device 110.

The system bus 116 of the communication device 110 represents any of the several types of bus structures, including a memory bus or memory controller, a peripheral bus, an accelerated graphics port, and a processor or local bus using any of a variety of bus architectures. The I/O component 114 may be configured to operatively communicate with one or more external networks 140, such as a cellular telephone network, a satellite network, an information network (e.g. Internet, intranet, cellular network, cable network, fiber optic network, LAN, WAN, etc.), an infrared or radio wave communication network, or any other suitable network.

The system memory 120 may include computer-readable media configured to store data and/or program modules for implementing the techniques disclosed herein that are immediately accessible to and/or presently operated on by the processor 112. For example, the system memory 120 may also store a basic input/output system (BIOS) 122, an operating system 124, one or more application programs 126, and program data 128 that can be accessed by the processor 112 for performing various tasks desired by a user of the communication device 110.

Moreover, the computer-readable media included in the system memory 120 can be any available media that can be accessed by the device 110, including computer storage media and communication media. Computer storage media may include both volatile and nonvolatile, removable and non-removable media implemented in any method or technology for storage of information such as computer-readable instructions, data structures, program modules, or other data. Computer storage media includes, but is not limited to, and random access memory (RAM), read only memory (ROM), electrically erasable programmable ROM (EEPROM), flash memory or other memory technology, compact disk ROM (CD-ROM), digital versatile disks (DVD) or other optical disk storage, magnetic cassettes, magnetic tape, magnetic disk storage or other magnetic storage devices, or any other medium, including paper, punch cards and the like, which can be used to store the desired information and which can be accessed by the communication device 110.

Similarly, communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection and wireless media such as acoustic, RF, infrared and other wireless media. Combinations of any of the above should also be included within the scope of computer readable media.

Generally, program modules executed on the device 110 (FIG. 2) may include routines, programs, objects, components, data structures, etc., for performing particular tasks or implementing particular abstract data types. These program modules and the like may be executed as a native code or may be downloaded and executed such as in a virtual machine or other just-in-time compilation execution environments. Typically, the functionality of the program modules may be combined or distributed as desired in various implementations.

Although the exemplary environment 100 is shown as in FIG. 2 as a communication network, this implementation is meant to serve only as a non-limiting example of a suitable environment for use of the CTSD modulator 150 in accordance with present disclosure. Similarly, the communication device 110 is simply one non-limiting example of a suitable device that may include CTSD modulators 150 in accordance with the present disclosure.

Exemplary Continuous-Time Sigma-Delta (CTSD) Modulators

Figure 1:
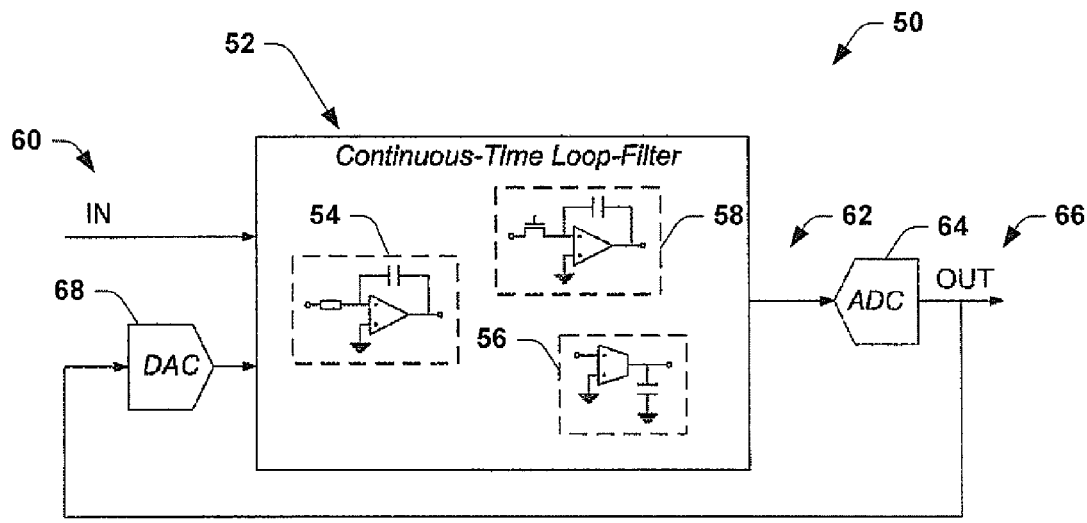
FIG. 1 is a continuous-time sigma-delta modulator in accordance with the prior art.
Figure 3:
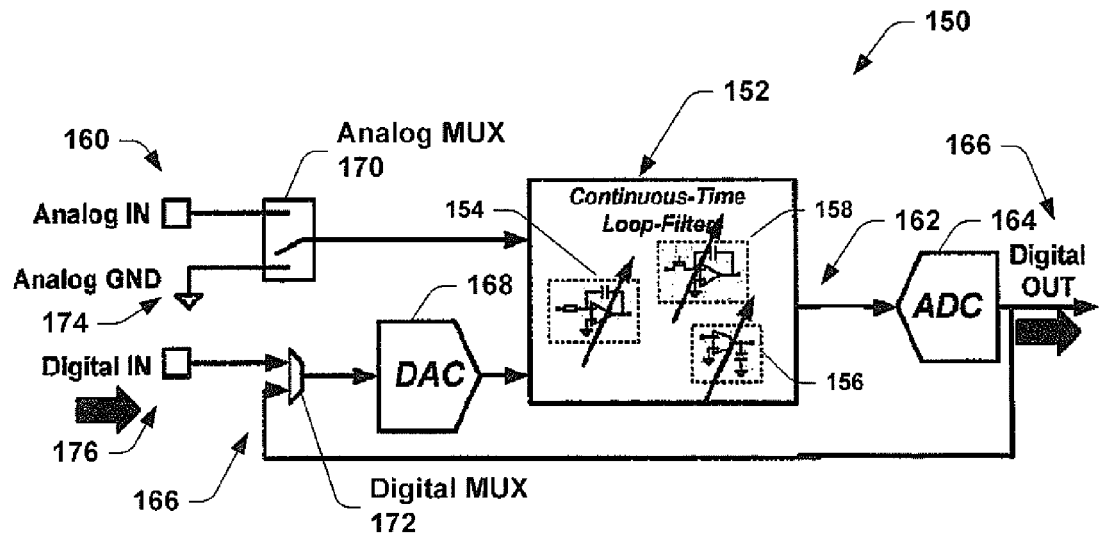
FIG. 3 is a continuous-time sigma-delta (CTSD) modulator in accordance with an implementation of the present disclosure.

Structural and operational aspects of implementations of continuous-time sigma-delta (CTSD) modulators in accordance with the present disclosure will now be described. A CTSD modulator 150 in accordance with an implementation of the present disclosure is shown in FIG. 3. In this implementation, the CTSD modulator 150 is controllably switchable from a normal "operating" mode to a "tuning" mode.

More specifically, as shown in FIG. 3, the CTSD modulator 150 includes a continuous-time loop-filter 152 having an input coupled to a digital-to-analog converter (DAC) 168, and an output coupled to an analog-to-digital converter (ADC) 164. The continuous-time loop-filter 152 can be implemented in any suitable manner (e.g. by using resistor-capacitors 154, transconductor-capacitors 156, MOSFET-capacitors 158, etc.). The particular configuration of the continuous-time loop-filter 152 is not relevant to the novel tuning techniques taught by the present disclosure, as such tuning techniques may generally be used in conjunction with any suitable continuous-time loop-filter architectures.

An analog input 160 is applied to an analog multiplexer (MUX) 170 that is coupled to an input of the continuous-time loop-filter 152. A filtered analog output 162 is passed from the continuous-time loop-filter 152 to an analog-to-digital converter (ADC) 164. A digital multiplexer 172 is coupled to another input of the continuous-time loop-filter 152. A first input of the analog MUX 170 is coupled to receive the analog input 160, while a second input is coupled to ground 174. Similarly, a first input of the digital MUX 172 is coupled to receive a digital stimulus signal 176, and a second input of the digital MUX 172 is coupled to receive a filtered digital output 166 that is fed back from the ADC 164.

In the operating mode, the analog MUX 170 transmits the analog input 160 to the continuous-time loop-filter 152 to perform normal filtering operations. A filtered analog output 162 is provided by the continuous-time loop-filter 152 to the ADC 164. In turn, the ADC 164 provides the filtered digital output 166 as desired, which is also fed back to the digital MUX 172. The digital MUX 172 is controllably configured (or switched) such that it passes the filtered digital output 166 to the DAC 168 for conversion and subsequent input to the continuous-time loop-filter 152 for use in the encoding process.

In the tuning mode, the analog MUX 170 is controllably configured (or switched) to an "open" position to prevent transmission of the analog input 160 to the continuous-time loop-filter 152. Similarly, the digital MUX 172 is controllably configured so that the digital stimulus signal 176 is provided to the DAC 168, enabling the continuous-time loop-filter 152 to be stimulated using a known input signal for tuning purposes. The response (i.e. the filtered digital output 166) from the continuous-time loop-filter 152 is then sensed and analyzed using known processing techniques, and various parameters of the continuous-time loop-filter 152 may be "trimmed" to improve (or optimize) filter performance. Following tuning, the analog and digital MUX 170, 172 may be switched back to their nominal positions, and the CTSD modulator 150 may resume performance in the normal operating mode.

In some implementations, the digital stimulus signal 176 may be generated "on-chip," such as by a random access memory, a linear feedback shift register, a squared-wave generator, or any other suitable on-chip signal source. Alternately, the digital stimulus signal 176 may be generated "off-chip," such as by a tester during production, by a DSP in the real application on field, or by any other off-chip source. Similarly, the processing of the response may be performed on-chip (e.g. by dedicated digital components) or off-chip (e.g. by a tester or DSP). The tuning control, and the adjustment of the parameters of the loop-filter 152, may similarly be performed on-chip (e.g. by a dedicated finite-state-machine) or off-chip (e.g. by a tester or DSP).

Figure 4:
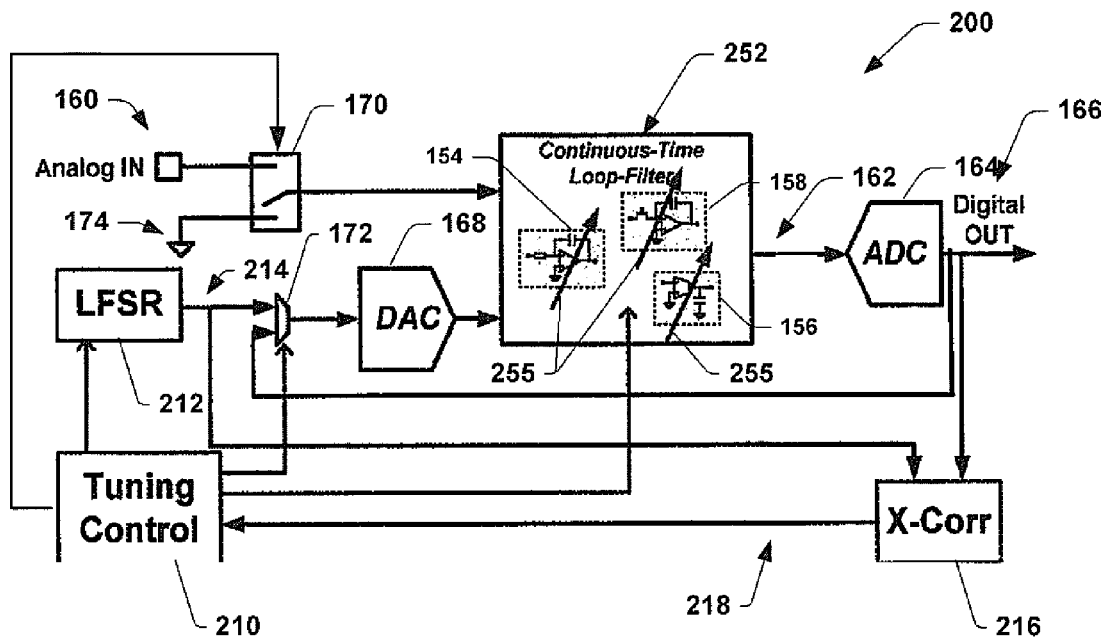
FIG. 4 is a CTSD modulator in accordance with another implementation of the present disclosure.

FIG. 4 is a CTSD modulator 200 in accordance with another implementation of the present disclosure. Many of the components of the CTSD modulator 200 are similar (or identical) to the components of the previously-described CTSD modulator 150, and are designated with the same reference numerals. For the sake of brevity, only significant differences between the CTSD modulator 200 and the previously-described implementation shown in FIG. 3 will be discussed in detail.

In this implementation, the CTSD modulator 200 includes a tuning controller 210 operatively coupled to provide control signals to the analog MUX 170, the digital MUX 172, and a continuous-time loop-filter 252. One or more parameters of the continuous-time loop-filter 252 may be controllably adjusted by the tuning controller 210, as depicted by arrows 255. An on-chip, linear feedback shift register (LFSR) 212 is coupled to receive a control signal from the tuning controller 210, and to apply a stimulation signal 214 to the first input of the digital MUX 172. An on-chip cross-correlation (X-Corr) calculator 216 is coupled to receive the filtered digital output 166 from the ADC 164, and also to receive the stimulation signal 214 from the LFSR 212. The X-corr calculator 216 outputs a correlation signal 218 to the tuning controller 210.

In the operating mode, the tuning controller 210 controls the analog MUX 170, causing the analog input 160 to be applied to the continuous-time loop-filter 252 to perform normal filtering operations. The filtered analog output 162 is received and converted by the ADC 164, resulting in the filtered digital output 166. The filtered digital output 166 is fed back to the digital MUX 172. The tuning controller 210 also controls the digital MUX 172 such that the filtered digital output 166 is applied to the DAC 168 for conversion and subsequent input to the continuous-time loop-filter 252 for use in the encoding process.

Alternately, in the tuning mode, the tuning controller 210 switches the analog MUX 170 to the open position to prevent transmission of the analog input 160 to the continuous-time loop-filter 252. Similarly, the tuning controller 210 switches the digital MUX 172, and controls the LFSR 212 so that the stimulation signal 214 is provided to the DAC 168, enabling the continuous-time loop-filter 252 to be stimulated using a known input signal for tuning purposes.

The response of the continuous-time loop-filter 252 to the stimulation signal 214 (i.e. the filtered digital output 166) is then received by the X-Corr calculator 216. The X-Corr calculator 216 correlates the filtered digital output 166 with the stimulation signal 214 from the LFSR 212, and provides the correlation signal 218 to the tuning controller 210. The tuning controller 210 analyzes the correlation signal 218 and uses known processing techniques to determine whether any adjustments 255 to the continuous-time loop-filter 252 are needed. For example, in a particular implementation, the tuning controller 210 may determine whether adjustments 255 are needed based on an analysis of the type generally disclosed in *Pseudo-Random Sequence Based Tuning System For Continuous-Time Filters* by Corsi et al. and published in the Proceedings of the IEEE International Symposium on Circuits and Systems, 16-20 Feb. 2004, Vol. 1, pp. 94-99, which publication is incorporated herein by reference. In alternate implementations, any other suitable analysis techniques may be employed. The process of tuning the continuous-time loop-filter 252 may be iteratively repeated as needed until an acceptable filter performance is achieved.

The tuning controller 210 may be configured to implement the tuning mode of the CTSD modulator 200 at any suitable time or based on any desired operating criteria. For example, the tuning mode may be initiated at start up of the CTSD modulator 200, periodically during operation of the CTSD modulator 200, may be triggered by one or more operating conditions of the CTSD modulator 200, may be manually triggered, or by any other suitable time or tuning criteria. After the continuous-time loop-filter 252 is trimmed to provide an acceptable filter performance, the tuning controller 210 may switch the analog and digital MUX 170, 172 back to their "operating" positions, and the CTSD modulator 200 may resume performance in the normal operating mode.

Figure 5:
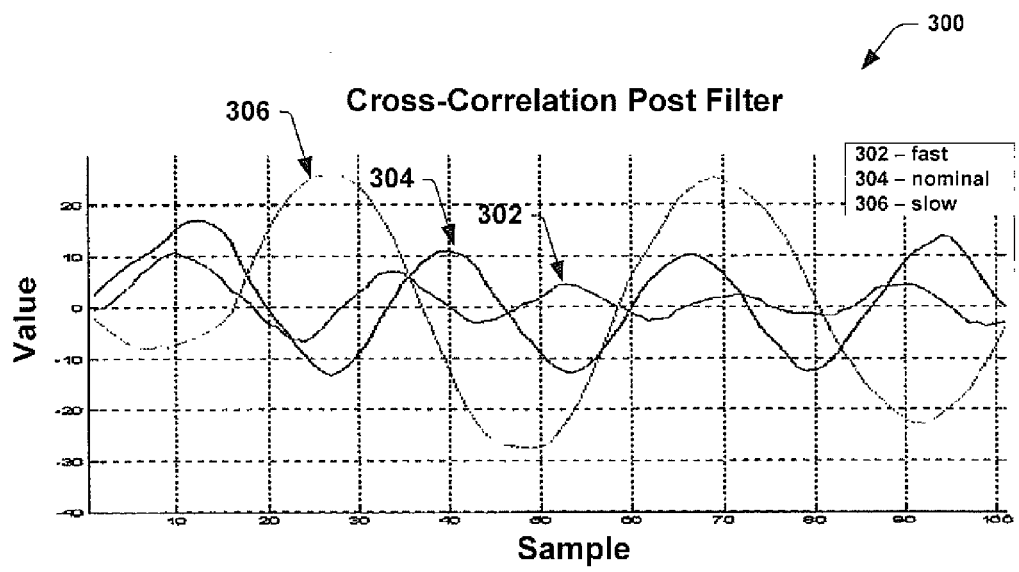
FIG. 5 is a graph of simulation results assuming the loop-filter is a resonator and using a moving-average filter in accordance with another alternate implementation of the present disclosure.

FIG. 5 is a graph of simulation results 300 assuming the continuous-time loop-filter is a resonator in accordance with another implementation of the present disclosure. In this example, the filtered digital output 166 from the ADC 164 (filtered using a moving-average filter) is plotted against a sample number for three different simulations having the same input but assuming differing levels of filtering realizations due to assumed variations in the fabrication processes.

More specifically, a "fast" signal 302 corresponds to an output when the process is "good," a "nominal" signal 304 corresponds to an output when the process is approximately "normal," and a "slow" signal 306 corresponds to an output when the process is "bad." In some implementations, a resonance frequency of the resonator (i.e. loop-filter) can be linked to a maximum amplitude of an output waveform (e.g. simulation results 302, 304, 306), and the resonator can thus be accurately tuned.

Having described an exemplary environment 100 and exemplary CTSD modulators 150, 200, exemplary processes for tuning CTSD modulators in accordance with the present disclosure will be described in the following section.

Exemplary Process

Specific implementations of exemplary processes are described below. However, it should be understood that, in alternate implementations, certain acts need not be performed in the order described, and may be modified, and/or may be omitted entirely, depending on the circumstances. Moreover, in various implementations, the acts described may be implemented by a computer, controller, processor, programmable device, or any other suitable device, and may be based on instructions stored on one or more computer-readable media or otherwise stored or programmed into such devices. In the event that computer-readable media are used, the computer-readable media can be any available media that can be accessed by a device to implement the instructions stored thereon.

Figure 6:
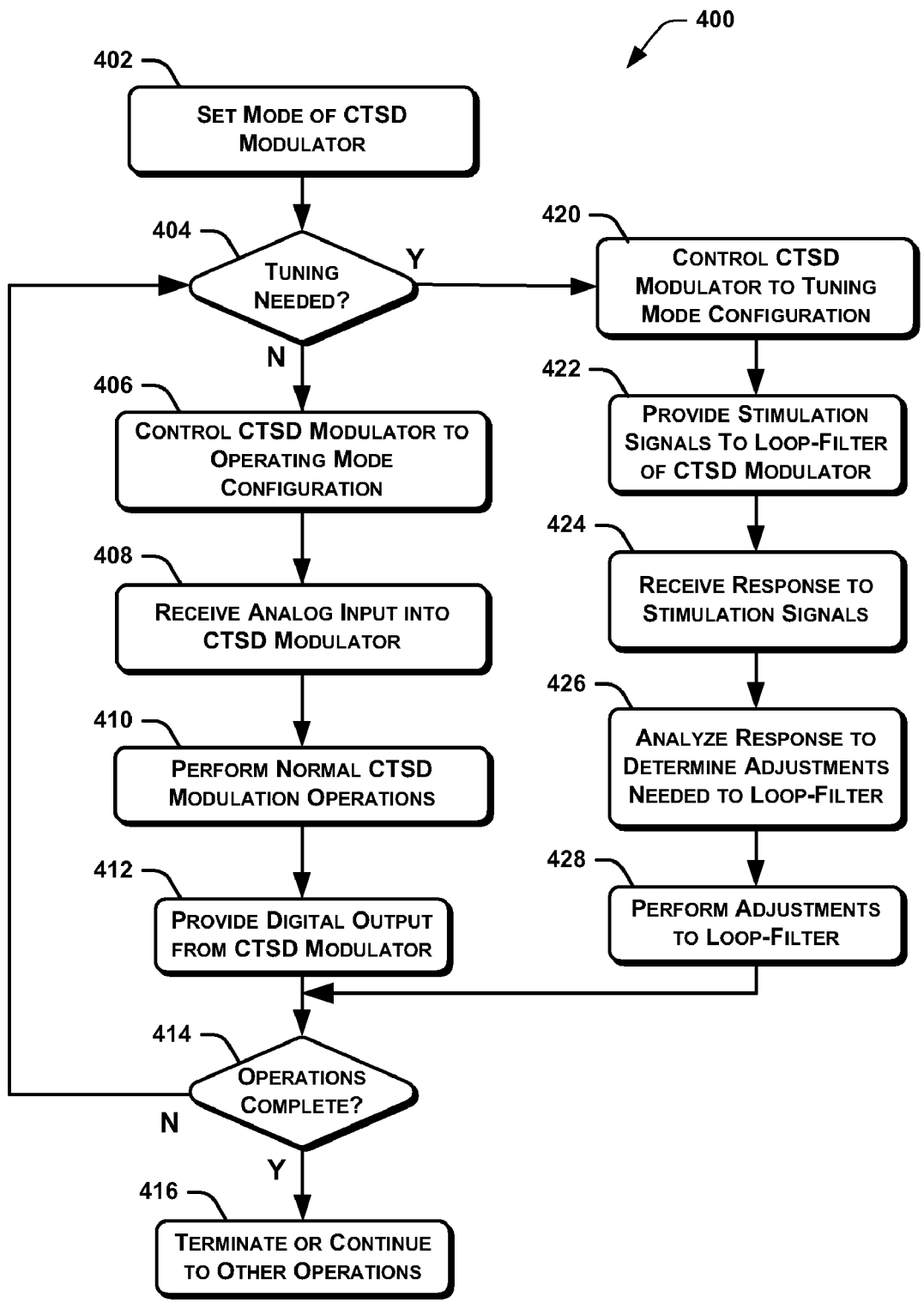
FIG. 6 is a flow chart showing a process for operating a CTSD modulator in accordance with yet another implementation of the present disclosure.

FIG. 6 is a flow chart showing an exemplary process 400 for operating a CTSD modulator in accordance with yet another implementation of the present disclosure. The process 400 is illustrated as a collection of blocks in a logical flow graph, which represents a sequence of operations that can be implemented in hardware, software, firmware, or a combination thereof. In the context of software, the blocks represent computer instructions that, when executed by one or more processors, perform the recited operations. For purposes of discussion, the process 400 is described with reference to the components of the exemplary environment 100 and the exemplary CTSD modulator 200 described above with reference to FIGS. 1 through 5.

In this implementation, the exemplary process 400 includes setting a mode of a CTSD modulator at 402. The mode may include an operating mode for performing normal modulation activities of the CTSD modulator, or may be a tuning mode for tuning the loop-filter of the CTSD modulator. In some implementations, such as when tuning of the CTSD modulator is desired at system start up, the mode may be initially set to the tuning mode. Alternately, the mode may be set to the normal operating mode, and tuning may be invoked based on one or more pre-determined tuning criteria.

At 404, a determination is made whether tuning of the loop-filter of the CTSD modulator is needed. The determination may be based on a current mode of the CTSD modulator (e.g. the mode is set to the tuning mode at 402), or may be based on one or more pre-determined tuning criteria (e.g. periodically during operation of the CTSD modulator, triggered by one or more operating conditions of the CTSD modulator, etc.), or any other suitable basis (e.g. manually triggered).

As further shown in FIG. 6, if tuning is not needed at 404, the process 400 controls (or maintains) the CTSD modulator in an operating mode configuration at 406. With respect to the implementation shown in FIG. 4, the operating mode configuration is set by a tuning controller 210 which controls an analog MUX 170 to apply an incoming analog signal 60 to an input of a continuous-time loop-filter 252, and controls a digital MUX 172 to enable feedback of a filtered digital output 166 from the loop-filter 252 (after conversion by an ADC 64) back into the loop-filter 252. In other implementations, the controlling (or maintaining) of the CTSD modulator into the operating mode configuration may involve other suitable actions or components.

At 408, an analog signal is received into the CTSD modulator, and normal modulation operations are performed by the CTSD modulator at 410. As a result of the normal modulation operations, the CTSD provides a digital output at 412. At 414, a determination is made whether operations of the CTSD modulator are complete. If so, then the process 400 terminates or continues to other operations at 416. If operations of the CTSD modulator are not complete (at 414), however, the process 400 returns to the determination of whether tuning of the loop-filter of the CTSD modulator is needed is needed at 404. If tuning remains unnecessary at 404, then the process 400 repeats the above-described activities (406-414) associated with normal operations of the CTSD modulate until modulation operations are complete (at 414), or until tuning is determined to be needed (at 404).

Once tuning operations are determined to be needed (or desired) at 404, the process 400 controls the CTSD modulator to a tuning mode configuration at 420. Again, for the implementation shown in FIG. 4, the tuning mode configuration is set by the tuning controller 210 which controls the analog MUX 170 to prevent the incoming analog signal 160 from being applied to the input of the continuous-time loop-filter 252, and controls the digital MUX 172 to apply a stimulus signal from a signal source (e.g. an LFSR 212) to the loop-filter 252. In other implementations, the controlling (or maintaining) of the CTSD modulator into the tuning mode configuration may involve other suitable actions or components.

With continued reference to FIG. 6, stimulation signals are provided to the loop-filter of the CTSD modulator at 422. The stimulation signals may be provided in any suitable way. In the particular implementation shown in FIG. 4, for example, the tuning controller 210 triggers an LFSR 212 to provide stimulus signals to the continuous-time loop-filter 252 via the digital MUX 172. The response of the loop-filter to the stimulus signals is received at 424, and the response is analyzed at 426 to determine whether adjustments to the loop-filter are needed (or desired).

The analysis of the response at 426 may be performed in any suitable way. For example, the response may be a filtered digital output 166, and may be received into an X-Corr calculator 216 (FIG. 4) that correlates the filtered digital output 166 with the stimulation signal 214 from the stimulation signal source (e.g. the LFSR 212), and provides a correlation signal 218 to the tuning controller 210. The tuning controller 210 (or other suitable component) may then analyze the correlation signal 218 and use known processing techniques to determine whether any adjustments to the continuous-time loop-filter 252 are needed.

Adjustments to the loop-filter, if any, may be performed at 428. The process 400 then returns to 414 to determine whether modulation operations are complete. If so, then the process 400 terminates or continues at 416. If operations are not complete (at 414), then the process 400 returns to the determination at 404, and the above-described activities associated with normal operations (404-414) and tuning operations (420-428) may be repeated indefinitely.

Implementations of techniques in accordance with the present disclosure may provide significant advantages over the known technologies. Because the tuning of the loop-filter is performed using the actual components of the CTSD modulator, no replica structure (less area on the device) is required, and circuit overhead is not significantly increased, to perform the tuning. Techniques in accordance with the present disclosure may therefore be highly attractive for implementation in complex integrated circuits. In addition, because the actual loop-filter of the CTSD modulator is used for tuning, non-idealities of the loop-filter may be properly taken into account during the tuning process, thereby providing improved tuning precision and improved accuracy of the CTSD modulator. Using techniques taught by the present disclosure, the tuning of the loop-filter becomes purely digital (as stimulus and response are both digital), thereby providing the desired tuning using less power and at higher speed in comparison with the known technologies and techniques. Overall, using teachings in accordance with the present disclosure, advantages in tuning accuracy and economy may be realized.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims. Accordingly, the scope of the invention should not be limited by the disclosure of the specific implementations set forth above. Instead, the invention should be determined entirely by reference to the claims that follow.

We claim:

1. A sigma-delta modulator circuit, comprising:
   in a first mode, a first switching device to provide an input signal for modulation, and a second switching device to provide a feedback signal;
   in a second mode, the first switching device is configured to prevent the input signal from being applied to a downstream element, and the second switching device is configured to provide a stimulus signal to the downstream element; and
   a linear feedback shift register, having an output terminal coupled to the second switching device, the linear feedback shift register configured to provide the stimulus signal to the second switching device during the second mode.

2. The sigma-delta modulator circuit as recited in claim 1, wherein the first mode is an operating mode.

3. The sigma-delta modulator circuit as recited in claim 1, wherein the second mode is a tuning mode.

4. The sigma-delta modulator circuit as recited in claim 1, wherein the first switching device comprises an analog multiplexer and the second switching device comprises a digital multiplexer.

5. The sigma-delta modulator circuit as recited in claim 1, wherein the first mode is an operating mode and the second mode is a tuning mode, the sigma-delta modulator circuit further comprising:
   a tuning controller coupled to provide control signals to the first and second switching devices to controllably switch between the operating mode and the tuning mode.

6. The sigma-delta modulator circuit as recited in claim 5, wherein the tuning controller is further coupled to provide control signals to adjust one or more parameters of the downstream element.

7. The sigma-delta modulator circuit as recited in claim 6, wherein the downstream element comprises a filtering portion.

8. The sigma-delta modulator circuit as recited in claim 5, further comprising:
   a correlation component coupled to receive the feedback signal in the operating mode, and coupled to receive the stimulus signal in the tuning mode and provide a correlation signal to the tuning controller based on a correlation of the downstream element's output signal and the stimulus signal, and
   wherein the tuning controller is further configured to adjust the one or more parameters of the downstream element based on the correlation signal.

9. A sigma-delta modulator circuit, comprising:
   in a first mode, a first switching device configured to receive a first input signal for modulation and to provide a first output signal to a downstream element, and a second switching device configured to receive a second input signal and to provide a second output signal to the downstream element;
   in a second mode, the first switching device is configured to prevent the first output signal from being applied to a downstream element, and the second switching device is configured to receive a stimulus signal and apply the stimulus signal to a downstream element to tune the downstream element; and
   a linear feedback shift register, having an output terminal coupled to the second switching device and an input terminal coupled to a tuning controller, the linear feedback shift register configured to provide the stimulus signal to the second switching device during the second mode.

10. The sigma-delta modulator circuit as recited in claim 9, wherein the first mode is an operating mode.

11. The sigma-delta modulator circuit as recited in claim 9, wherein the second mode is a tuning mode.

12. The sigma-delta modulator circuit as recited in claim 9, wherein the downstream element comprises at least one filtering portion.

13. The sigma-delta modulator circuit as recited in claim 9, wherein the tuning controller is coupled to provide control signals to the first and second switching devices to controllably switch between the first mode and the second mode.

14. The sigma-delta modulator circuit as recited in claim 13, further comprising:
   a correlation component coupled to receive the downstream element's output signal, and coupled to receive the stimulus signal in the second mode, and to provide a correlation signal to the tuning controller based on a correlation between the output signal of the downstream element and the stimulus signal, and
   wherein the tuning controller is further configured to adjust the one or more parameters of the downstream element based on the correlation signal.

15. An electronic device, comprising:
   a processor;
   a communication component operatively coupled to the processor and configured to at least one of receive and transmit communication signals, the communication component including:
   a sigma-delta modulator component having:
   in a first mode, a first switching device to provide an input signal for modulation, and a second switching device to provide a feedback signal;
   in a second mode, the first switching device is configured to prevent the input signal from being applied to a downstream element, and the second switching device is configured to provide a stimulus signal to the downstream element; and a linear feedback shift register, having an output terminal coupled to the second switching device, the linear feedback shift register configured to provide the stimulus signal to the second switching device during the second mode.

16. The electronic device as recited in claim 15, further comprising a tuning controller coupled to provide control signals to the first and second switching devices to controllably switch between the first mode and the second mode.

17. The electronic device as recited in claim 16, wherein the first mode is an operating mode and the second mode is a tuning mode.

18. The electronic device as recited in claim 16, wherein the sigma-delta modulator component further comprises:
a correlation component coupled to receive the downstream element output signal, and coupled to receive the stimulus signal in the second mode, and to provide a correlation signal to the tuning controller based on the correlation of the downstream output signal and stimulus signals.

19. The electronic device as recited in claim 16, wherein an input terminal of the linear feedback shift register is coupled to the tuning controller.

* * * * *